(12) United States Patent
Brobston

(10) Patent No.: US 9,002,303 B2
(45) Date of Patent: Apr. 7, 2015

(54) METHOD AND APPARATUS FOR PROGRAMMABLE ENVELOPE SHAPING CIRCUIT BASED ON PIECEWISE LINEAR INTERPOLATION

(75) Inventor: Michael Brobston, Allen, TX (US)

(73) Assignee: Samsung Electronics Co., Ltd., Suwon-Si (KR)

( * ) Notice: Subject to any disclaimer, the term of this patent is extended or adjusted under 35 U.S.C. 154(b) by 506 days.

(21) Appl. No.: 13/474,603

(22) Filed: May 17, 2012

(65) Prior Publication Data

US 2012/0302179 A1    Nov. 29, 2012

Related U.S. Application Data

(60) Provisional application No. 61/490,958, filed on May 27, 2011.

(51) Int. Cl.
  H04B 1/04     (2006.01)
  H03F 3/24     (2006.01)
  H03F 1/02     (2006.01)
  H03F 3/195    (2006.01)

(52) U.S. Cl.
  CPC ............ *H03F 3/24* (2013.01); *H03F 1/0266* (2013.01); *H03F 3/195* (2013.01); *H04B 1/0483* (2013.01); *H03F 2200/102* (2013.01); *H03F 2200/15* (2013.01); *H04B 2001/045* (2013.01)

(58) Field of Classification Search
  USPC ........................ 455/73–88, 91–129
  See application file for complete search history.

(56) References Cited

U.S. PATENT DOCUMENTS

| | | | | |
|---|---|---|---|---|
| 4,641,361 | A * | 2/1987 | Rosback | 330/278 |
| 6,566,944 | B1 * | 5/2003 | Pehlke et al. | 330/10 |
| 7,196,583 | B2 * | 3/2007 | Clifton et al. | 330/285 |
| 7,333,778 | B2 * | 2/2008 | Pehlke et al. | 455/114.3 |
| 8,068,622 | B2 * | 11/2011 | Melanson et al. | 330/199 |
| 2005/0046474 | A1 * | 3/2005 | Matsumoto et al. | 330/10 |
| 2008/0048781 | A1 * | 2/2008 | Wagner et al. | 455/127.2 |
| 2011/0316623 | A1 * | 12/2011 | Bohn et al. | 330/127 |

* cited by examiner

Primary Examiner — Lana N Le

(57) ABSTRACT

An analog envelope shaper within an envelope tracking power amplifier system detects an envelope voltage of a transmission signal and generates a shaped envelope amplifier control signal based upon a programmable threshold, below which the output does not fall, and a plurality of different voltages centered around a corresponding threshold input voltage, a selectable spacing of which controls the shape of the transition between negative clipping and linear regions of the envelope detector output function. The programmable features and the resulting piecewise linear shaping allow for tailoring of the envelope response to balance linearity and efficiency, without negating the efficiency benefits of envelope tracking power amplification. Since the analog envelope shaper employs no high speed data converter functions, the resulting power dissipation will be substantially less than digital designs.

20 Claims, 14 Drawing Sheets

501

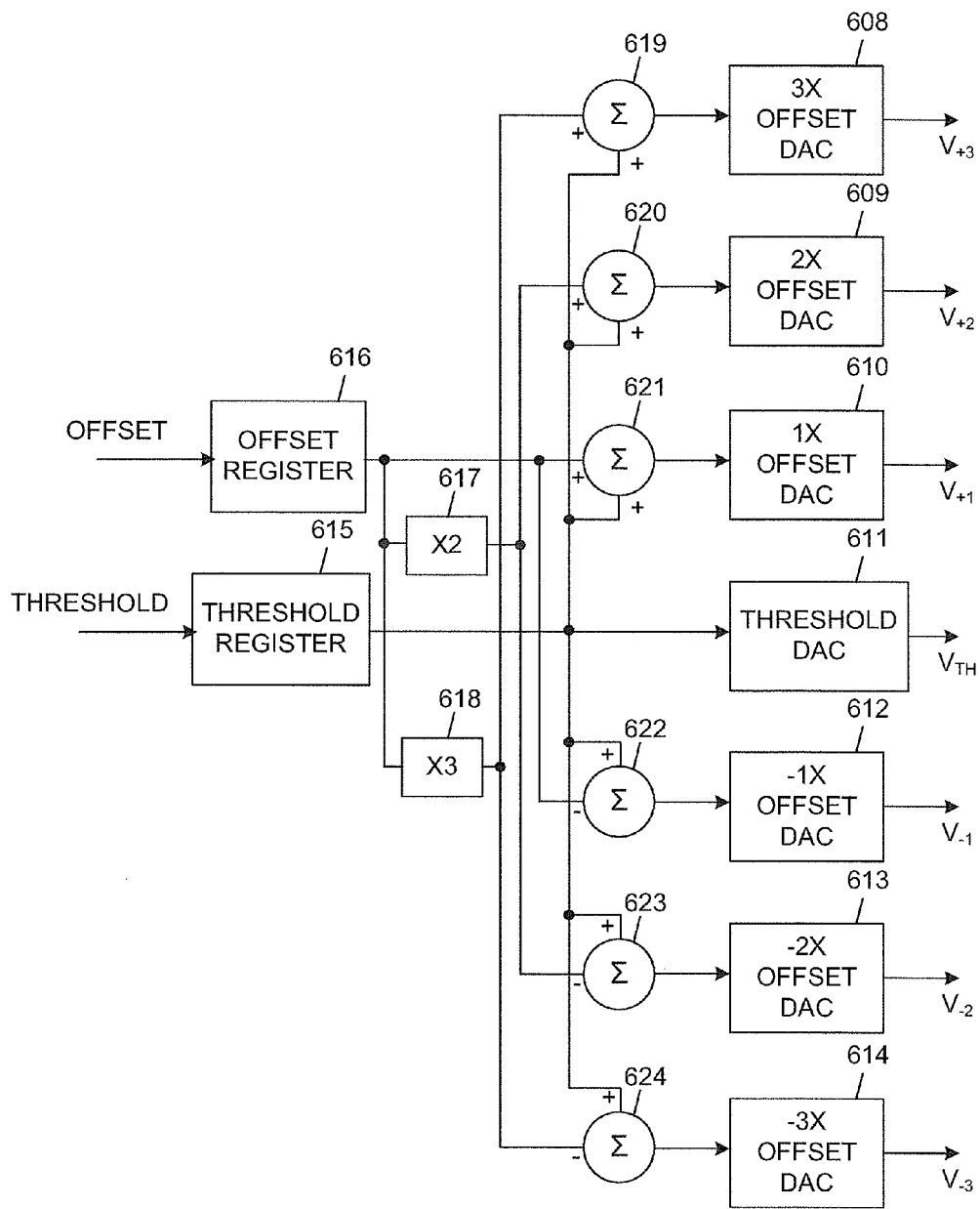
FIGURE 6B    501

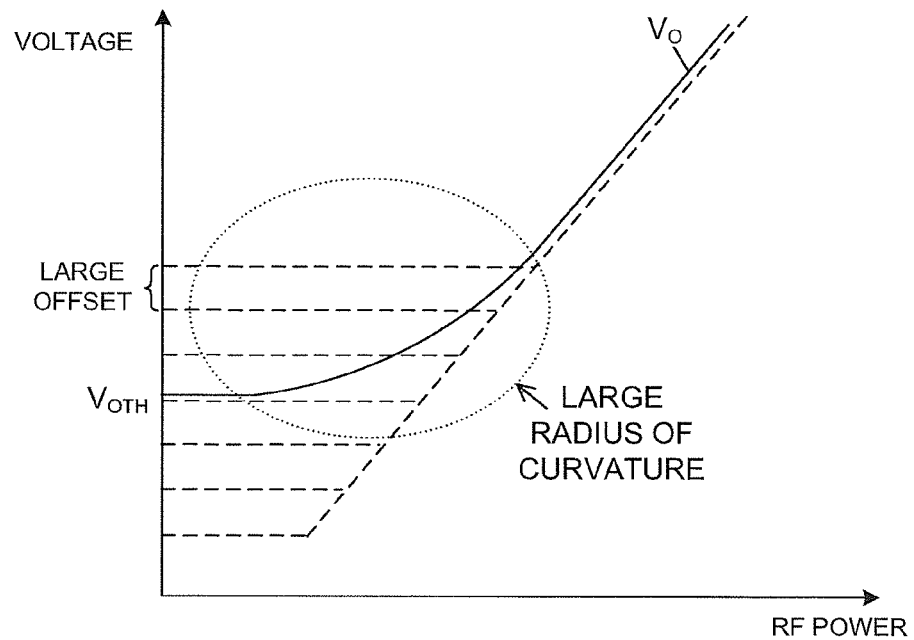
FIGURE 12C
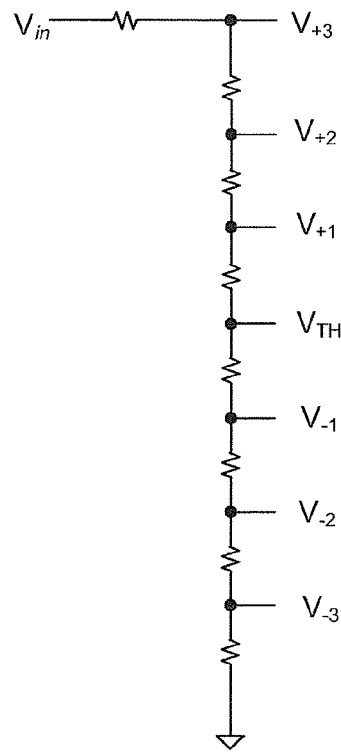 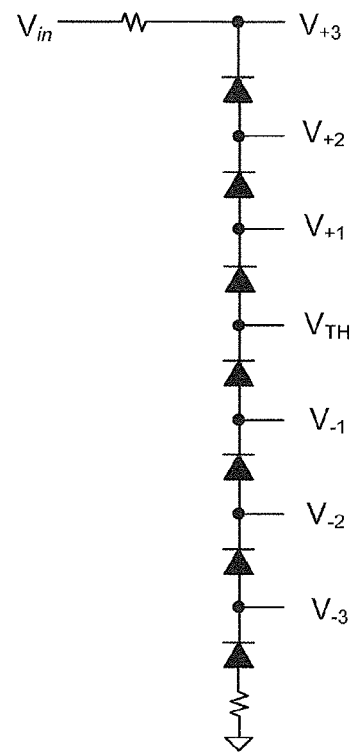
FIGURE 13A　　　　FIGURE 13B

_US 9,002,303 B2_

METHOD AND APPARATUS FOR PROGRAMMABLE ENVELOPE SHAPING CIRCUIT BASED ON PIECEWISE LINEAR INTERPOLATION

CROSS-REFERENCE TO RELATED APPLICATION(S) AND CLAIM OF PRIORITY

This application claims priority to U.S. Provisional Patent Application No. 61/490,958, filed May 27, 2011, entitled "METHOD AND APPARATUS FOR PROGRAMMABLE ENVELOPE SHAPING CIRCUIT BASED ON PIECEWISE LINEAR INTERPOLATION." The above-identified patent document is hereby incorporated by reference.

TECHNICAL FIELD

The present disclosure relates generally to wireless communication signal envelope tracking systems and, more specifically, to envelope tracking power amplifier systems.

BACKGROUND

Conventional radio frequency (RF) power amplifiers using a fixed or constant supply voltage are much less efficient when backed off from maximum power. However, complex modulation schemes of the type used in many contemporary wireless communication systems require linear power amplification, which compromises overall system efficiency. Envelope tracking (ET) is an approach to RF power amplifier (PA) design in which the power supply voltage applied to the power amplifier is constantly adjusted to ensure that the amplifier is operating at peak efficiency for the given instantaneous output power requirements. However, all-digital and all-analog envelope tracking each implicate inherent drawbacks.

There is, therefore, a need in the art for improved envelope tracking power amplification.

SUMMARY

An analog envelope shaper within an envelope tracking power amplifier system detects an envelope voltage of a transmission signal and generates a shaped envelope amplifier control signal based upon a programmable threshold, below which the output does not fall, and a plurality of different voltages centered around a corresponding threshold input voltage, a selectable spacing of which controls the shape of the transition between negative clipping and linear regions of the envelope detector output function. The programmable features and the resulting piecewise linear shaping allow for tailoring of the envelope response to balance linearity and efficiency, without negating the efficiency benefits of envelope tracking power amplification. Since the analog envelope shaper employs no high speed data converter functions, the resulting power dissipation will be substantially less than digital designs.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIGS. 6A and 6B each depict one circuit implementing the multiple direct current threshold block within the piecewise linear shaping circuit of FIG. 5;

FIGS. 12A through 12C illustrate the shaped envelope voltage output by the piecewise linear shaping circuit of FIG. 5;

FIGS. 13A and 13B each depict alternative circuits implementing the multiple direct current threshold block within the piecewise linear shaping circuit of FIG. 5.

DETAILED DESCRIPTION

Figure 1:
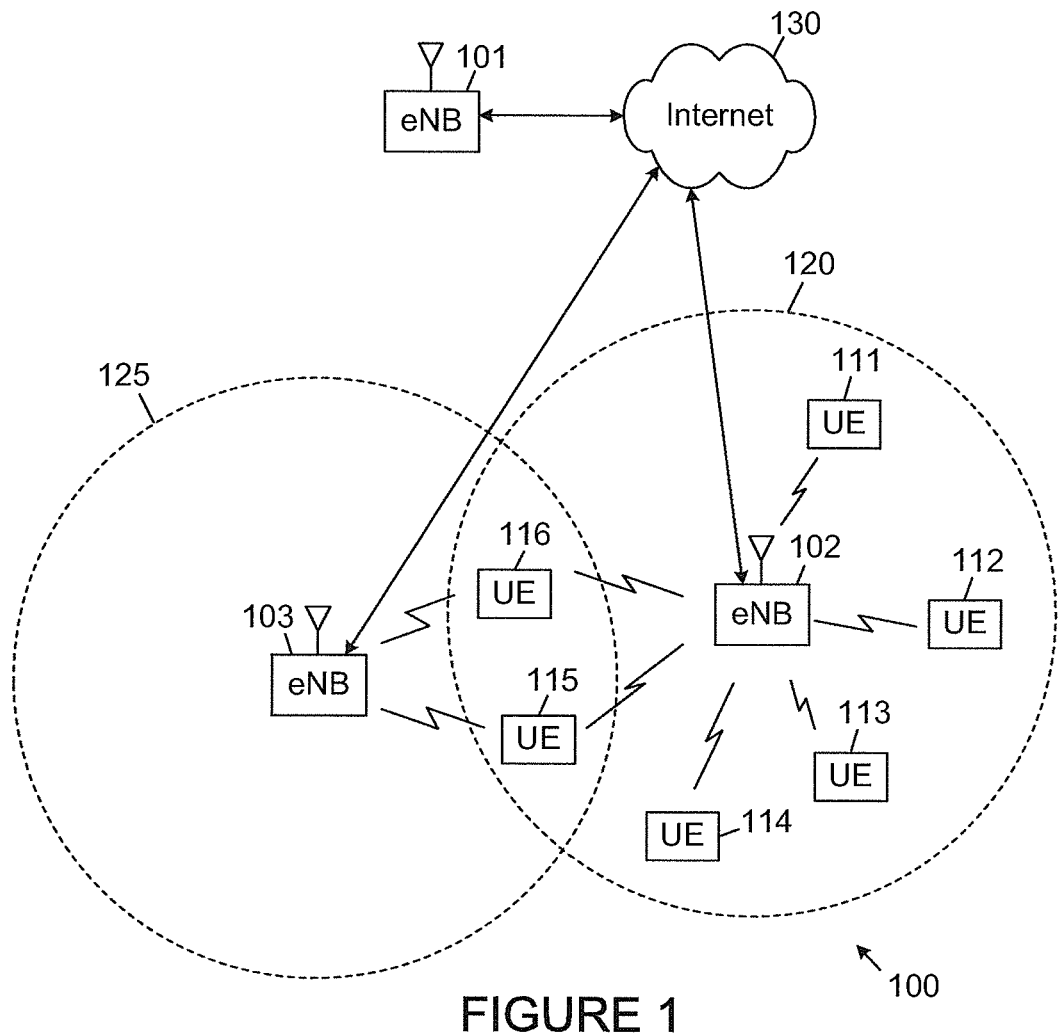
FIG. 1 is a high level block diagram illustrating an exemplary wireless network implementing programmable envelope-shaping based on piecewise linear interpolation according to one or more embodiments of the present disclosure.

FIGS. 1 through 14, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication system.

Envelope tracking power amplifier systems may contain some form of minimum envelope limiting in the envelope path, to prevent the drain voltage of an output power amplifier transistor from dropping below the drop-out voltage. A hard limiting function on the envelope minimas can cause added distortion and increased power dissipation. In digital envelope processing, some form of digital envelope shaping may be added to provide a smooth transition between the linear or square-law envelope tracking region and the fixed, limiting region. This may be performed using a look-up table, since having control of the envelope shaping function allows a balance of linearity and efficiency to be optimized using the shaping function. However, a digital envelope path has disadvantages in that, for terminal applications, the commercial baseband devices do not contain the necessary envelope detection and shaping functions. In addition, digital envelope detection necessitates a bandwidth expansion of greater than 5× the signal bandwidth. Therefore, the digital-to-analog converter (DAC) used to produce the analog envelope voltage must have a sample rate that is more than 5× higher than the DAC used for the signal path. This high sample rate requirement causes excess power dissipation.

In completely analog envelope tracking systems, the envelope may be produced using a detector circuit that is often based on a diode. While the completely analog system avoids some of the above-described issues relating to a digital envelope path, the approach does not generally include an envelope shaping block in the path that allows full programmability of the shaping function. Therefore, the linearity of the envelope tracking system using an all-analog approach may not be optimized.

For a wireless terminal operating with high peak-to-average waveform signals such as those transmitted in Long Term Evolution (LTE) and WiMax communication systems, power amplifier efficiency is a major issue directly impacting battery life in mobile equipment. While Class AB power amplifiers may provide efficiency in the range of 20% to 25%, envelope tracking power amplifiers have been demonstrated with efficiency greater than 50%. This significant amount of improvement has a large impact on extended battery life. The envelope tracking system requires extraction of the signal envelope and, for best linearity, requires some shaping of this envelope prior to its use as an input to an envelope modulator. Historically, this shaping function has been implemented digitally due to limitations on capability to implement a programmable analog shaper. Yet the digital implementation has significant impact on the baseband Application Specific Integrated Circuit (ASIC), which is undesirable. To maintain autonomy from the digital baseband ASIC and yet provide a programmable envelope shaping function requires that envelope tracking be implemented in analog hardware between the analog detector and the envelope modulator.

In order to retain the advantages of an all-analog envelope tracking system—specifically, both elimination of the need to include the envelope tracking system within the baseband ASIC and elimination of a high sample rate DAC in the envelope path—it is highly desirable to develop a programmable envelope shaping function that can be implemented in hardware between the analog envelope detector and the envelope modulator. The present disclosure provides this programmable, all-analog solution in an architecture that possesses low gate count and low power consumption. The programmable analog envelope shaper described in the present disclosure is a function that enables a fully analog envelope tracking solution to avoid impact on the baseband ASIC and yet provide full control of the envelope shaping, in order to optimize the power amplifier linearity while maintaining the efficiency benefits of envelope tracking. This enables development of a fully self-contained envelope tracking power amplifier solution that operates with commercially available standard baseband ASIC and Radio Frequency Integrated Circuit (RFIC) devices.

FIG. 1 is a high level block diagram illustrating an exemplary wireless network implementing programmable envelope-shaping based on piecewise linear interpolation according to one or more embodiments of the present disclosure. The wireless network 100 illustrated in FIG. 1 is provided solely for purposes of explaining the subject matter of the present disclosure, and is not intended to suggest any limitation regarding the applicability of that subject matter. Other wireless networks may employ the subject matter depicted in the drawings and described herein without departing from the scope of the present disclosure. In addition, those skilled in the art will recognize that the complete structure and operation of a wireless network and the components thereof are depicted in the drawings and described therein. Instead, for simplicity and clarity, only so much of the structure and operation of the wireless network and the components thereof as are unique to the present disclosure or necessary for an understanding of the present disclosure are depicted and described.

In the illustrated embodiment, wireless network 100 includes an Evolved Node B ("eNodeB" or "eNB") 101, eNB 102, and eNB 103. Depending on the network type, other well-known terms may be used instead of "eNB," such as "base station" or "access point." For simplicity and clarity, the term "eNB" will be used herein to refer to the network infrastructure components that provide wireless access to remote (mobile or fixed) terminals.

The eNB 101 communicates with eNB 102 and eNB 103 via network 130 operating according to a standardized protocol (e.g., ×2 protocol), via a proprietary protocol, or preferably via Internet protocol (IP). IP network 130 may include any IP-based network or a combination thereof, such as the Internet, a proprietary IP network, or another data network.

The eNB 102 provides wireless broadband access to a first plurality of user equipments (UEs) within coverage area 120 of eNB 102. The first plurality of UEs includes UE 111, which may be located in a small business; UE 112, which may be located in an enterprise; UE 113, which may be located in a wireless fidelity (WiFi) hotspot; UE 114, which may be located in a first residence; UE 115, which may be located in a second residence; and UE 116, which may be a mobile device, such as a cell phone, a wireless laptop, a wireless-enabled tablet, or the like. For simplicity and clarity, the term "user equipment" or "UE" is used herein to designate any remote wireless equipment that wirelessly accesses an eNB, whether the UE is a mobile device (e.g., cell phone, wireless-enabled tablet or laptop, etc.) or is normally considered a stationary device (e.g., desktop personal computer, wireless television receiver, etc.). In other systems, other well-known terms may be used instead of "user equipment," such as "mobile station (MS)," "subscriber station (SS)," "remote terminal (RT)," "wireless terminal (WT)," and the like.

The eNB 103 provides wireless broadband access to a second plurality of UEs within coverage area 125 of eNB 103. The second plurality of UEs includes UE 115 and UE 116. In an exemplary embodiment, eNBs 101-103 may communicate with each other and with UE 111-116 using Long Term Evolution (LTE) or LTE-A wireless communication techniques. While only six UEs are depicted in FIG. 1, it will be understood that wireless network 100 may provide wireless broadband access to additional UEs. It should be noted that UE 115 and UE 116 are located on the edges of both coverage area 120 and coverage area 125. UE 115 and UE 116 each communicate with both eNB 102 and eNB 103 and may be said to be operating in handoff mode, as known to those of skill in the art.

Figure 2:
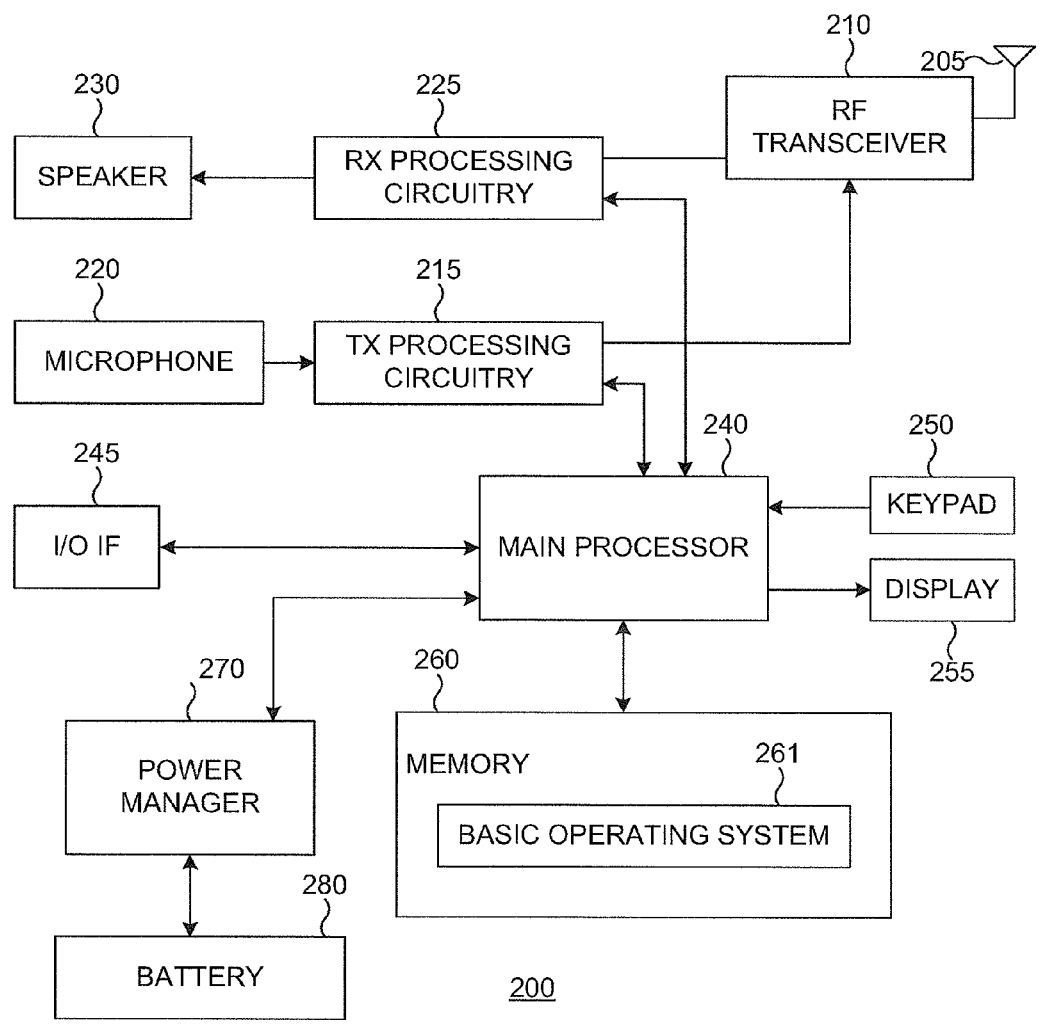
FIG. 2 illustrates user equipment implementing programmable envelope-shaping based on piecewise linear interpolation according to one or more embodiments of the present disclosure.

FIG. 2 illustrates user equipment implementing programmable envelope-shaping based on piecewise linear interpolation according to one or more embodiments of the present disclosure. UE 200 may represent any of the UEs 111-116 shown in FIG. 1. The particular structure of UE 200 illustrated in FIG. 2 is for illustration purposes only; other embodiments of UE 200 may be used to implement the subject matter of the present disclosure without departing from the scope of the disclosure.

In the exemplary embodiment of FIG. 2, UE 200 comprises antenna 205, radio frequency (RF) transceiver 210, transmit (TX) processing circuitry 215, microphone 220, and receive (RX) processing circuitry 225. UE 200 also comprises speaker 230, main processor 240, input/output (I/O) interface (IF) 245, keypad 250, display 255, memory 260, power manager 270, and battery 280.

Radio frequency (RF) transceiver 210 receives from antenna 205 an incoming RF signal transmitted by an eNB 101, 102 or 103 of wireless network 100 in FIG. 1. Radio frequency (RF) transceiver 210 down-converts the incoming RF signal to produce an intermediate frequency (IF) or a baseband signal. The IF or baseband signal is sent to receiver (RX) processing circuitry 225 that produces a processed baseband signal by filtering, decoding, and/or digitizing the baseband or IF signal. Receiver processing circuitry 225 transmits the processed baseband signal to speaker. 230 (i.e., voice data) or to main processor 240 for further processing (e.g., to execute functions in connection with web browsing).

Transmitter (TX) processing circuitry 215 receives analog or digital voice data from microphone 220 or other outgoing baseband data (e.g., web data, e-mail, interactive video game data) from main processor 240. Transmitter processing circuitry 215 encodes, multiplexes, and/or digitizes the outgoing baseband data to produce a processed baseband or IF signal. Radio frequency (RF) transceiver 210 receives the outgoing processed baseband or IF signal from transmitter processing circuitry 215. Radio frequency (RF) transceiver 210 up-converts the baseband or IF signal to a radio frequency (RF) signal that is transmitted via antenna 205.

In some embodiments of the present disclosure, main processor 240 is a microprocessor or microcontroller. Memory 260 is coupled to main processor 240. Memory 260 can be any computer readable medium. For example, memory 260 can be any electronic, magnetic, electromagnetic, optical, electro-optical, electro-mechanical, and/or other physical device that can contain, store, communicate, propagate, or transmit a computer program, software, firmware, or data for use by the microprocessor or other computer-related system or method. According to such embodiments, part of memory 260 comprises a random access memory (RAM) and another part of memory 260 comprises a Flash memory, which acts as a read-only memory (ROM).

Main processor 240 executes basic operating system (OS) program 261 stored in memory 260 in order to control the overall operation of mobile station 200. In one such operation, main processor 240 controls the reception of forward channel signals and the transmission of reverse channel signals by radio frequency (RF) transceiver 210, receiver (RX) processing circuitry 225, and transmitter (TX) processing circuitry 215, in accordance with well-known principles.

Main processor 240 is capable of executing other processes and programs resident in memory 260. Main processor 240 can move data into or out of memory 260, as required by an executing process. Main processor 240 is also coupled to power manager 270, which is further coupled to battery 280. Main processor 240 and/or 270 power manager may include software, hardware, and/or firmware capable of controlling and reducing power usage and extending the time between charges of battery 280. In certain embodiments, power manager 270 may be separate from main processor 240. In other embodiments, power manager 270 may be integrated in, or otherwise a part of, main processor 240. Power manager 270 is connected to and controls other components within US 200, beyond the connections depicted in FIG. 2.

Main processor 240 is also coupled to keypad 250 and display unit 255. The operator of UE 200 uses keypad 250 to enter data into UE 200. Display 255 may be a liquid crystal or light emitting diode (LED) display capable of rendering text and/or graphics from web sites. Alternate embodiments may use other types of displays.

Figure 3A:
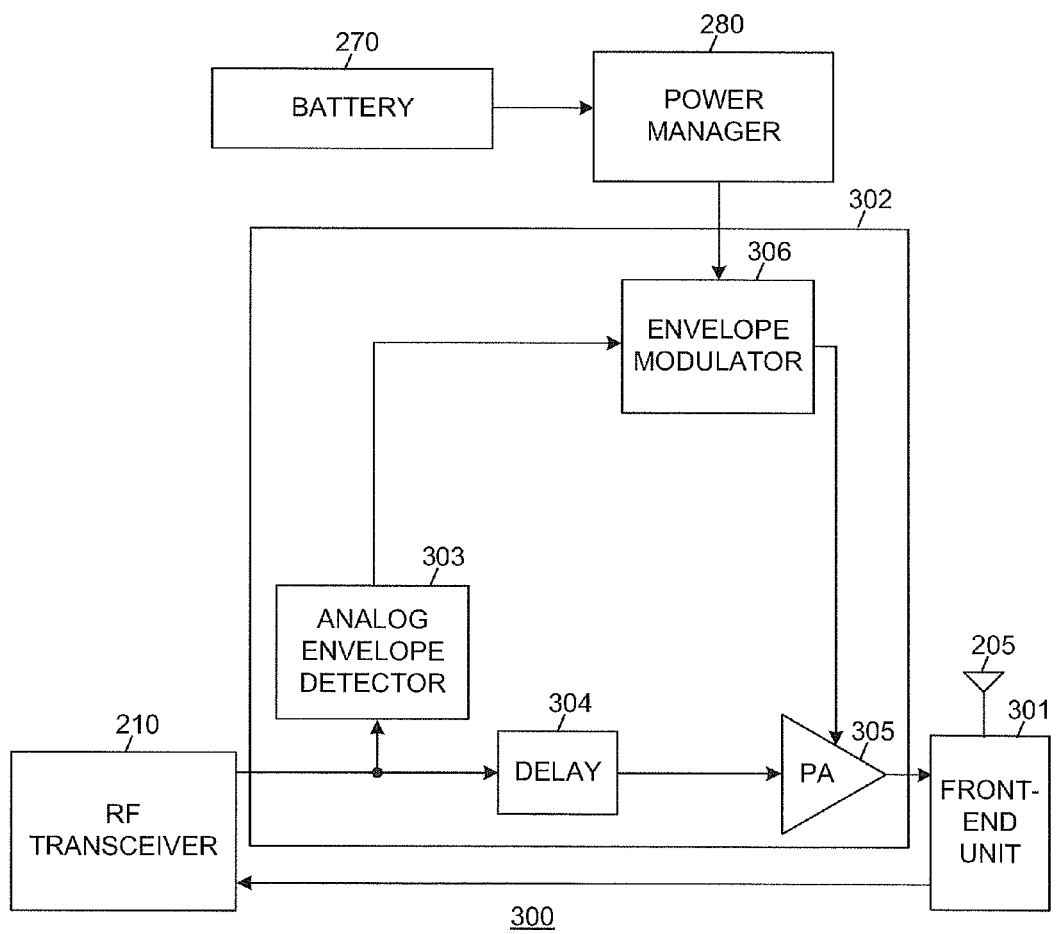
FIGS. 3A, 3B and 3C are block diagrams comparatively illustrating various envelope tracking power amplifier architectures, including a programmable analog envelope-shaping architecture based on piecewise linear interpolation according to one embodiment of the present disclosure.
Figure 3B:
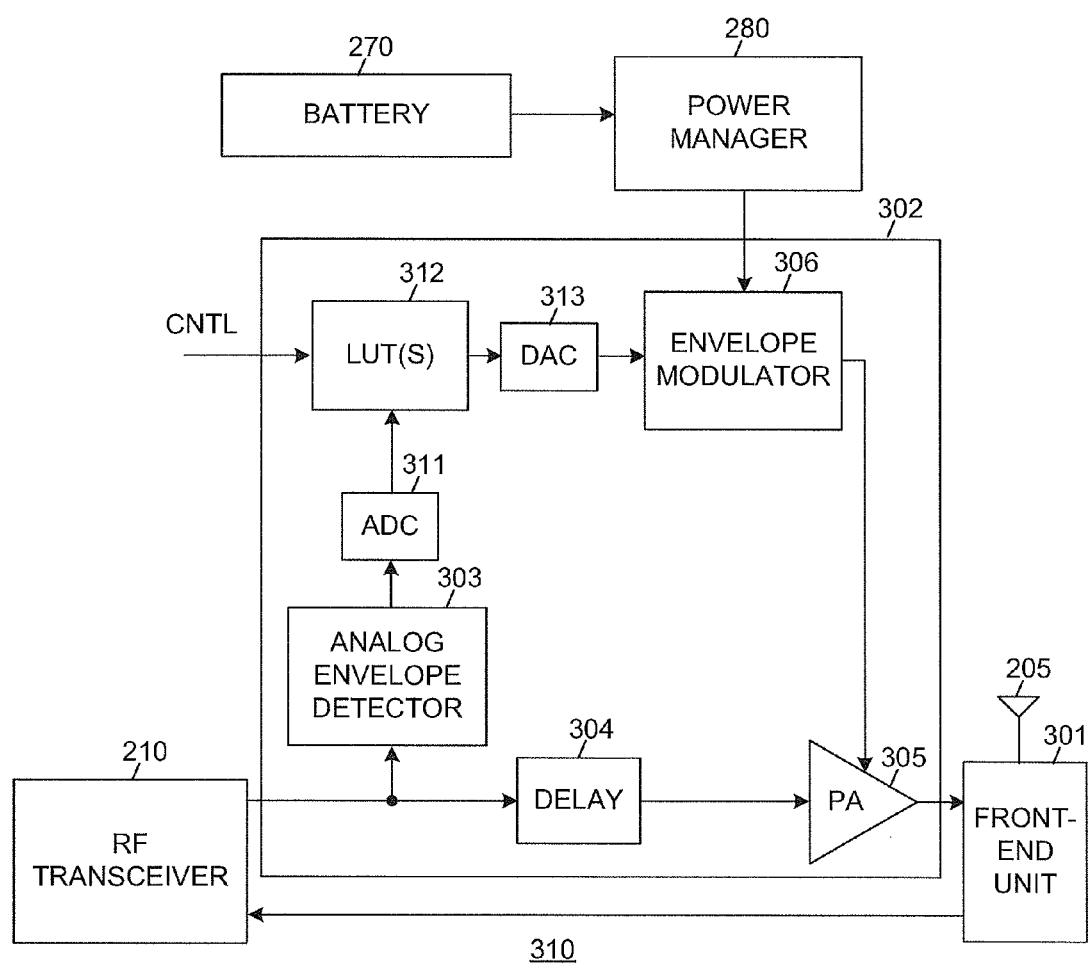
Figure 3C:
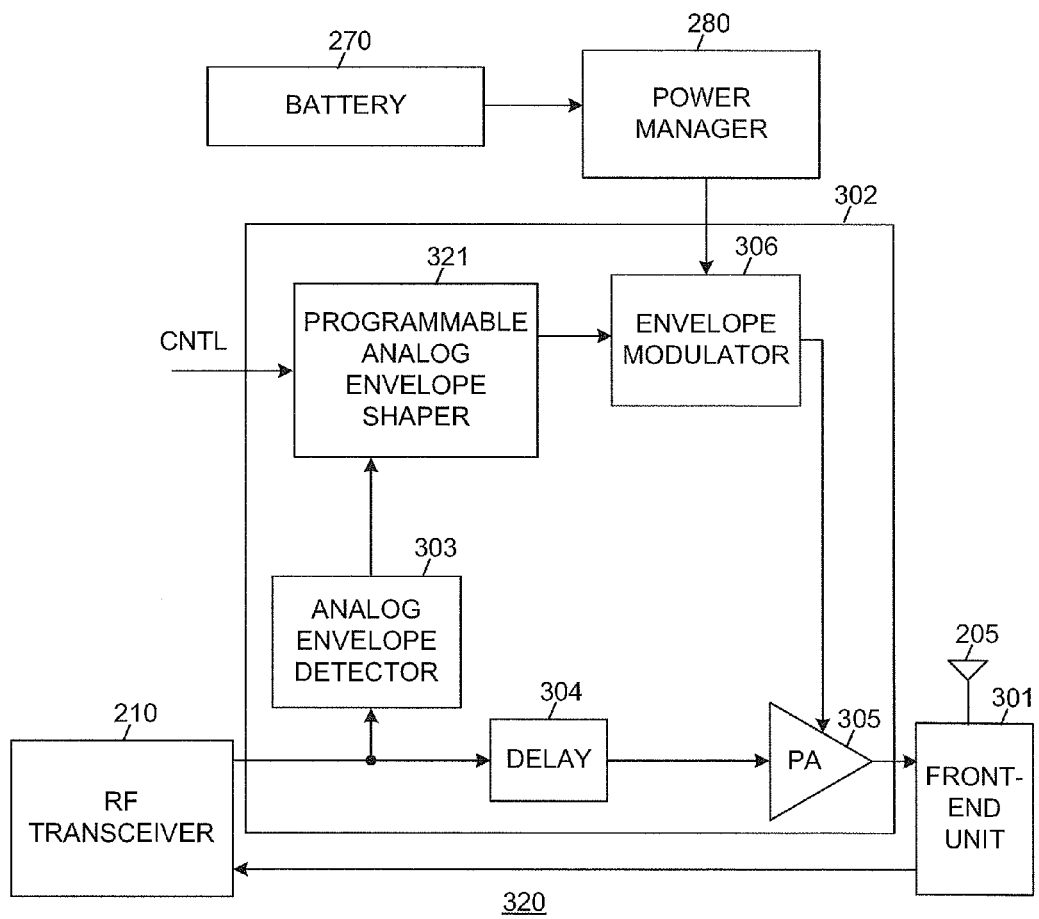

FIGS. 3A, 3B and 3C are block diagrams comparatively illustrating various envelope tracking power amplifier architectures, including a programmable analog envelope-shaping architecture based on piecewise linear interpolation according to one embodiment of the present disclosure. The envelope tracking power amplifiers are implemented in UE 200 in the exemplary embodiment, but may alternatively be implemented within an eNB. An envelope tracking power amplifier architecture may be used in a wireless communication system to gain improved efficiency in operation of the power amplifier. In this technique, the drain or collector bias voltage of a power transistor is modulated dynamically in proportion to the envelope of the RF signal. This is accomplished by detecting the envelope of the transmitted waveform and then using this envelope signal to drive an envelope modulator which in turn supplies a high current drain supply voltage to the transistor.

One example of an envelope tracking power amplifier architecture is depicted in FIG. 3A. The circuit 300 implementing envelope tracking power amplification is disposed within a signal path between the RF transceiver 210 and antenna 205. A front-end unit 301 is connected between the antenna 205 and transceiver 210, and preferably includes, for example, a low noise block converter and other functionality in accordance with the known art. Signals received on the antenna 205 are converted or otherwise processed and passed directly to transceiver 210 by front-end unit 301, but signals originating from the transceiver 210 are first operated on by envelope tracking power amplifier 302 before being forwarded to front-end unit 301 to be broadcast via antenna 205.

Envelope tracking power amplifier 302 in FIG. 3A includes an analog envelope detector 303 coupled to an output of the transceiver 210 and receiving the transmit signal from the transceiver 210. As described above, analog envelope detector 303 detects the envelope of the waveform to be transmitted. Also coupled to the output of transceiver 210 and receiving the same transmit signal is a delay unit 304, which delays passage of the transmit signal along the signal path to power amplifier 305 while an output of the analog envelope detector 303 is operated on by the envelope modulator 306. As described above, the envelope modulator 306 is driven by the envelope signal analog envelope detector 303 and in turn supplies, under control of power manager 280, a high current drain supply voltage to a power transistor within the power amplifier 305. The output of power amplifier 305 is the envelope tracked, power amplified signal to be transmitted by front-end unit 301 via antenna 205.

One deficiency of the architecture depicted in FIG. 3A is that a lower limit should be maintained on the envelope voltage provided to the power transistor within power amplifier 305, in order to prevent the drain voltage of that transistor from dropping below the transistor drop-out voltage. If such an event occurs, the power transistor gain collapses and potential recovery delays on the positive slope of the envelope may result in distortion or non-linearities within the transmitted signal. Maintaining a lower limit on the envelope voltage may be accomplished, for example, by using a negative clipping function to prevent the envelope voltage from dropping below a pre-determined threshold value.

Figure 4:
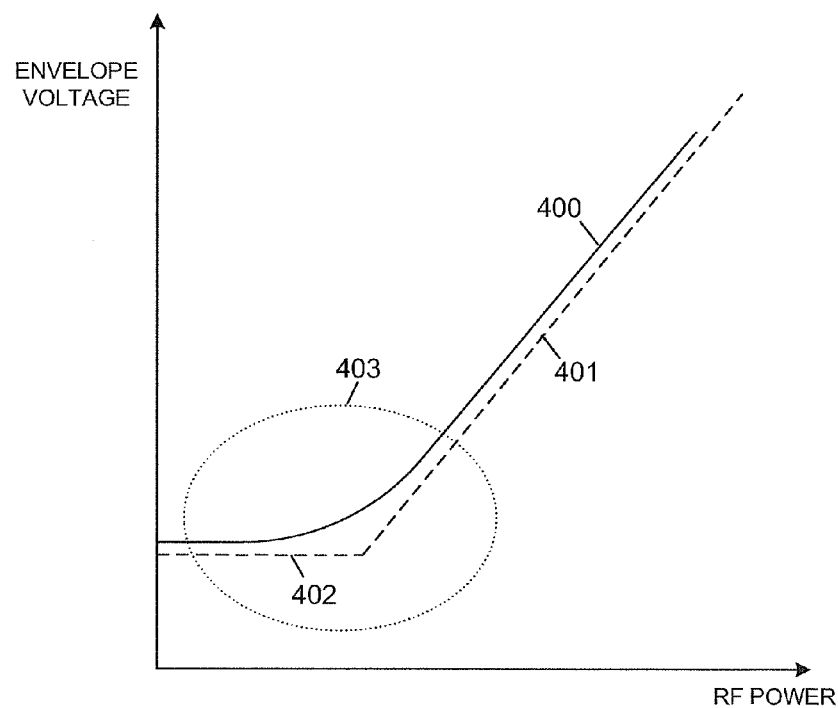
FIG. 4 illustrates the envelope response from a hard clipping function implemented by an envelope detector circuit configured to maintain a lower limit on the envelope voltage.

Placing a hard limit on the minimum envelope voltage can result in excessive non-linearities in the ET power amplifier due to the abrupt discontinuity in the envelope response. A hard limit can also result in excessive bandwidth expansion of the envelope signal, which places even greater constraints on the envelope modulator. FIG. 4 illustrates the envelope response from a hard clipping function implemented by an envelope detector circuit configured to maintain a lower limit on the envelope voltage. The envelope voltage for the shaped envelope response 400 output by the envelope tracking power amplifier is plotted as a function of RF power, with dashed lines indicating the hard limited envelope response 401 and the lower threshold voltage 402. To reduce the envelope bandwidth and reduce ET power amplifier non-linearities, a shaping or smoothing function can be applied to the envelope to provide a smoothed transition in the region indicated by the dotted oval 403, at the transition point between the minimum voltage and the non-limited peak envelope response as also shown in FIG. 4. The minimum threshold and curvature radius of the shaping function have a significant effect on the overall linearity and efficiency of the power amplifier 305 and envelope modulator 306. As such, it is desirable to have programmable capability on these parameters in order to optimize the shaping function relative to the power amplifier transistor and envelope modulator characteristics.

To supply the needed programmability, an ET system may perform both the envelope detection function and envelope shaping function digitally, in the digital section of the transmitter. The digital envelope detector is perfectly accurate in its transfer response. The digital envelope shaping block, often consisting of one or more memory based look-up table (LUTs) that are pre-loaded with an optimized polynomial shape, provides excellent versatility in establishing the envelope shaping response in order to optimize the balance between efficiency and linearity of the ET power amplifier.

However, implementation of the shaping function controlling the curvature radius 403 with digital envelope detector and envelope shaping blocks has several drawbacks. First, the envelope of a modulated signal typically has much greater bandwidth than the modulated signal by a factor greater than 5 times the bandwidth. In a sampled system, this forces the minimum sample rate to be interpolated to at least 5 times the rate of the modulated waveform, which in turn creates relatively high power dissipation in the data converters (DACs) that are used to recover the envelope waveform in the analog domain.

A second disadvantage is that often the digital and RF sections of a transmitter are partitioned either into separate circuit boards, ASICs, or RFICs. Therefore if the envelope detection and shaping functions are embedded within a modem ASIC where the modulated signal is still in the digital domain, gain variations or delay variations in the RF portion of the transmitter between the modem ASIC and the power amplifier, such as an RFIC, can impact the accuracy of the envelope tracking operation causing inefficient or non-linear operation.

A third disadvantage of digital envelope detector and shaping functions is that for a transmitter system based on commercially available modem ASIC devices and RFICs, the envelope detector and shaping blocks are not typically included in those devices. To implement envelope tracking in commercial wireless terminals thus requires that custom modem ASIC and RFIC devices be designed and manufactured to include these features. Since it is often prohibitively expensive to design and manufacture customized devices for commercial wireless terminals, it would be preferred to maintain the envelope detection and shaping functions in the power amplifier block rather than in the modem ASIC or RFIC portions of the transmitter. For these reasons it would be advantageous for the envelope detector and shaping functions to be implemented directly at the ET power amplifier input.

Because of the difficulties in implementing the various digital envelope path blocks and integrating these with the analog blocks, an alternative design implementing the envelope detector and shaping functions may be to implement these directly at the ET power amplifier input. The issue in this analog detection approach is encountered in providing a programmable envelope shaping function. One approach to perform this function with a high degree of accuracy and versatility would require that the envelope detector output be digitized using a very high speed analog-to-digital converter (ADC) 311 as shown in the architecture 310 depicted FIG. 3B. The output of the ADC provides the indexing for one or more memory-based look-up tables (LUTs) 312 in which the appropriate shaping function is digitally stored and accessed under control of an external control signal CNTL. The output of the LUT(s) 312 provides the shaped envelope signal that would then be converted back to analog domain using a digital-to-analog converter (DAC) 313. The DAC output is filtered to eliminate image response, and the filtered output is then used as the envelope modulator input.

An apparent disadvantage of this approach is that very high sample rate and power dissipation are required for both the ADC 311 and DAC 313, due to the large bandwidth expansion that occurs during the envelope detection process. For an RF signal having a bandwidth of 10 mega-Hertz (MHz), the analog detector output could easily have a bandwidth extending to greater than 50 MHz. This would require the ADC 311, memory-based LUT 312, and DAC 313 to operate at greater than 100 mega-samples per second (Msps). The power dissipated by such a system could very easily exceed the amount of power saved in the power amplifier by using the envelope tracking technique, which would likely render this approach useless especially for low power wireless terminal transmitters having output power of less than 1 watt (W).

In the present disclosure, a programmable analog envelope shaping function is used to follow the envelope detector block as shown in the architecture 320 of FIG. 3C. In order to preserve the requisite versatility in setting the envelope shaping response, the programmable analog envelope shaping block 321 includes programmable features that allow for tailoring of the response to optimize the balance of power amplifier linearity and efficiency. Yet to avoid nullifying the efficiency benefits of the ET power amplifier approach, the analog shaping function must be implemented in an architecture that dissipates very little power. The present disclosure describes such a programmable analog envelope shaping function, implementing the programmable envelope shaping function in one embodiment based on a piecewise linear shaping circuit.

Figure 5:
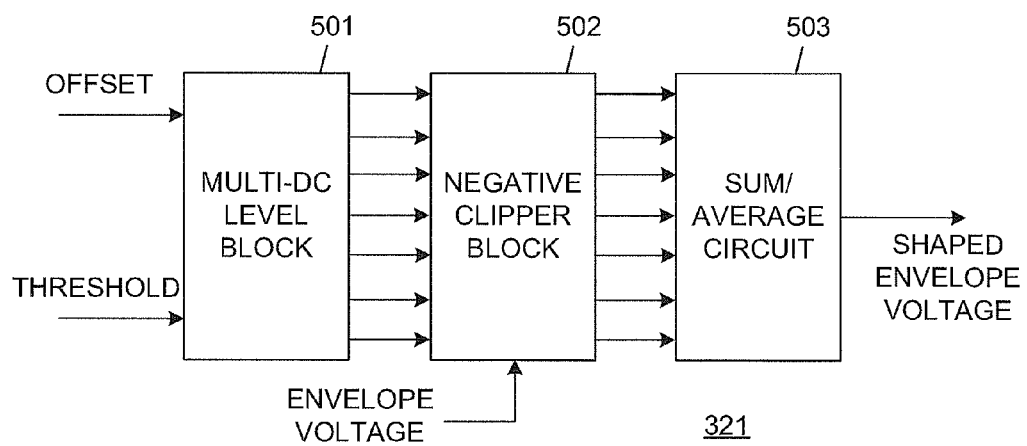
FIG. 5 depicts a circuit implementing piecewise linear shaping for a programmable analog envelope-shaping architecture according to one embodiment of the present disclosure.

FIG. 5 depicts a circuit implementing a piecewise linear shaping for a programmable analog envelope-shaping architecture according to one embodiment of the present disclosure. In the circuit 321, a multiple direct current (DC) threshold circuit 501 generates multiple DC voltages centered around the desired threshold voltage. The desired threshold voltage is programmed by loading a threshold value on the THRESHOLD input and the curvature radius of the shaping function is programmed by loading an offset value on the OFFSET input. Multiple DC threshold circuit 501 is structured to provide a quantity of DC voltages. The quantity of DC voltages determines the smoothness of curvature of the shaping function. In the exemplary embodiment, the quantity of DC voltages is seven, but the circuit may be implemented with any quantity of discrete DC voltages greater than 1.

The multiple DC voltages output by the multiple DC threshold circuit 501 are provided to a negative clipper block 502 along with the envelope voltage provided from the envelope detector. The negative clipper block 502 consists of multiple negative clipping circuits each using the multiple DC voltages from the multiple DC threshold block 501 as a threshold. Each of the negative clipper circuit produces an output voltage in which the minimum voltage of the processed envelope is limited to one of input threshold voltages.

All of the negative clipped envelope waveforms produced by the negative clipper block 502 are provided to the sum/average circuit 503. The sum/average circuit 503 produces a simple average of the multiple clipped envelope waveforms in order to produce a piecewise linear approximation of the desired shaping function as the shaped envelope function.

Figure 6A:
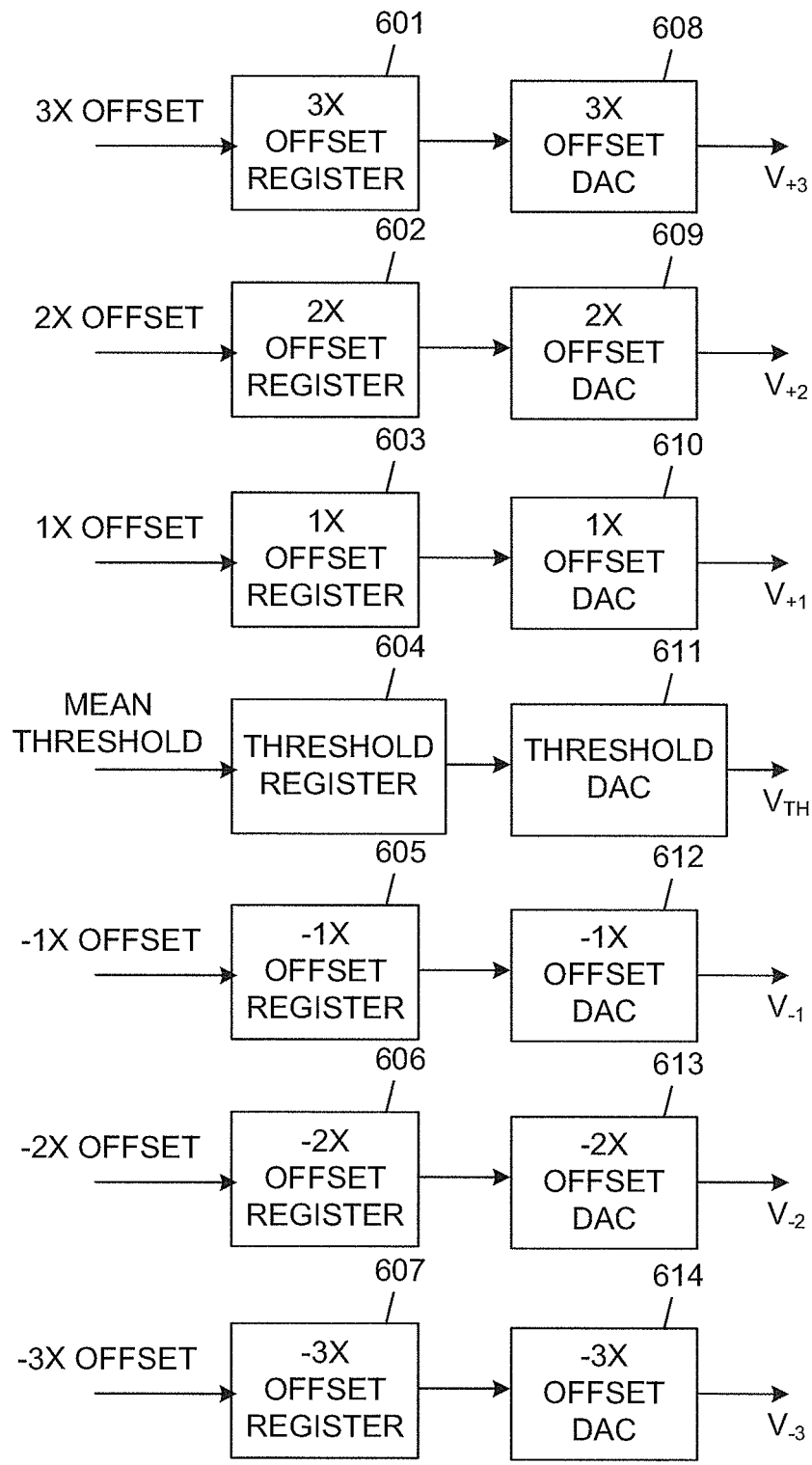

FIGS. 6A and 6B each depict one circuit implementing the multiple direct current threshold block within the piecewise linear shaping circuit of FIG. 5. The multiple DC threshold block 501 must be designed to provide a capability to program a mean threshold value and to set the breakpoints needed for the piecewise linear interpolation of the shaping curve. In the embodiment of FIG. 6A, multiple registers 601 through 607 are used to accept and store digital values representing the various DC voltage levels 3X OFFSET, 2X OFFSET, 1X OFFSET, MEAN THRESHOLD, −1X OFFSET, −2X OFFSET and −3X OFFSET, respectively. The threshold register MEAN THRESHOLD contains the target threshold value and the various offset registers contain values that are at predetermined offsets ±1, ±2 or ±3 either above or below the target threshold. Each of these registers 601-607 provides the value stored therein to a corresponding DAC (digital to analog converter) 608-614. The DACs 608-614 provide DC voltages corresponding to the piecewise linear function breakpoints $V_{+3}, V_{+2}, V_{+1}, V_{TH}, V_{-1}, V_{-2}$ and $V_{-3}$. Since the DACs 608-614 do not operate on the envelope waveform, neither high resolution nor high speed operation is required. Therefore the DACs 608-614 may be designed to consume very low DC power in order to convert the registered value to a corresponding DC voltage. The output of the multiple DC threshold block 501 then is multiple, static, DC voltages that effectively set the breakpoints of the piecewise linear interpolation of the shaping function. Although seven DACs 608-614 and DC voltage outputs as shown in FIGS. 6A and 6B, that quantity is shown for illustration purposes only. As described above, the multiple DC threshold block 501 may be designed for either a greater or lesser number of DC voltage outputs.

In the embodiment of FIG. 6B, the multiple DC threshold block 501 includes only one threshold register 615 and one offset register 616. The value stored in the offset register is multiplied by 2 and by 3 in the corresponding multiplier blocks 617, 618. The offset value, the 2X multiple, and the 3X multiple are added and subtracted from the threshold value by adders 619-624 to form multiple values at the threshold plus the offset value (from adder 621), the threshold plus 2 times the offset (from adder 620), the threshold plus 3 times the offset (from adder 619), the threshold minus the offset value (from adder 622), the threshold minus 2 times the offset (from adder 623), and the threshold minus 3 times the offset (from adder 624). The threshold value and each of the integer multiples of the offset value added and subtracted from the threshold value are provided to DACs 608-614 for conversion into DC voltages $V_{+3}, V_{+2}, V_{+1}, V_{TH}, V_{-1}, V_{-2}$ and $V_{-3}$. As with the embodiment of FIG. 6A, the DACs 608-614 provide DC voltages corresponding to the piecewise linear function breakpoints and, since they do not operate on the envelope waveform, neither high resolution nor high speed operation is required. Therefore the DACs 608-614 may be designed to consume very low DC power in order to convert the registered value to a corresponding DC voltage. The output of the multiple DC threshold block 501 is once again multiple, static, DC voltages that effectively set the breakpoints of the piecewise linear interpolation of the shaping function.

Figure 7:
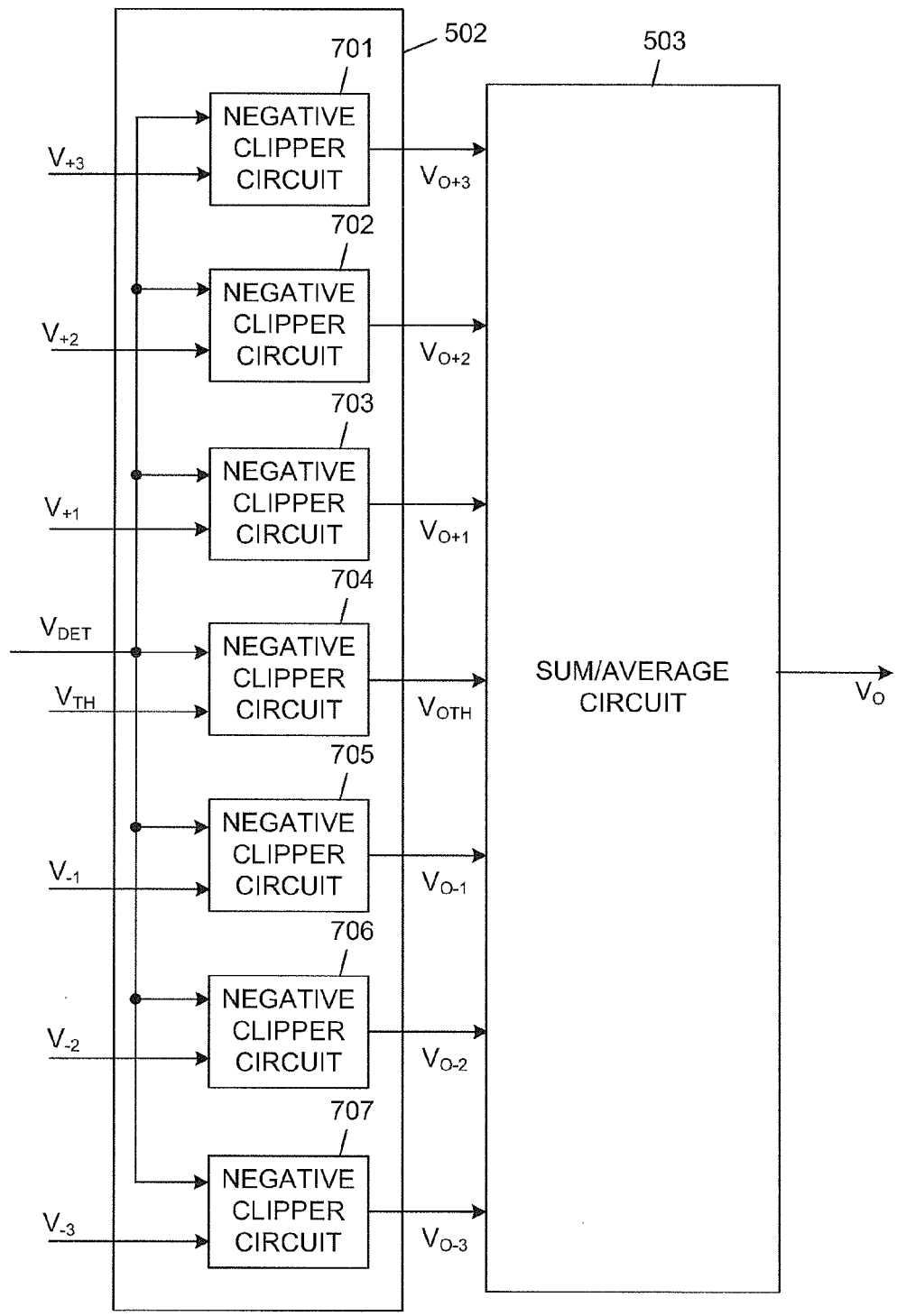
FIG. 7 is a block diagram of one implementation for the negative clipper block within the piecewise linear shaping circuit of FIG. 5.
Figure 8:
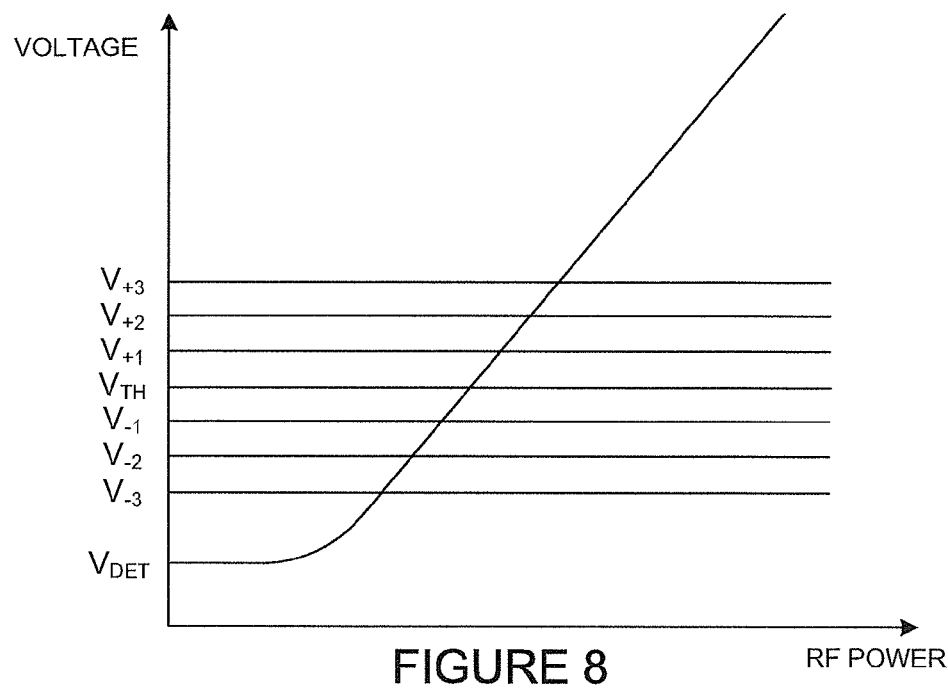
FIG. 8 illustrates the relative levels of the multiple DC voltages and the envelope voltage received by the negative clipper block within the piecewise linear shaping circuit of FIG. 5.
Figure 9A:
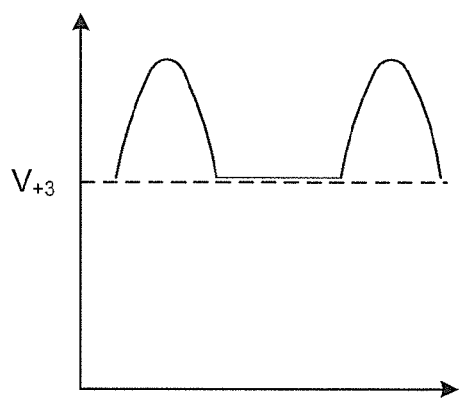
FIGS. 9A through 9C illustrate examples of limiting the envelope waveform based on one of the DC voltages using the negative clipper block within the piecewise linear shaping circuit of FIG. 5.
Figure 9B:
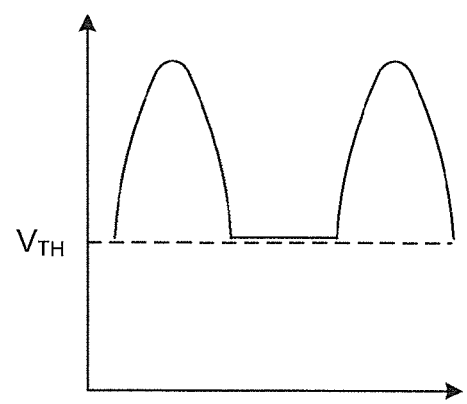
Figure 9C:
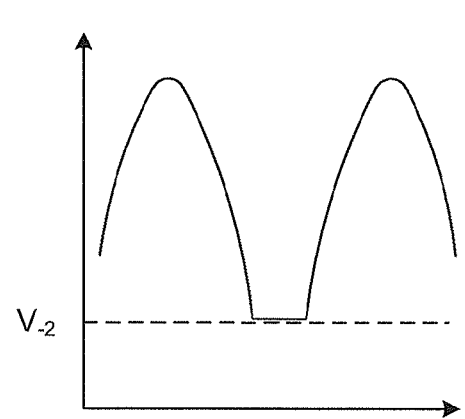
Figure 10:
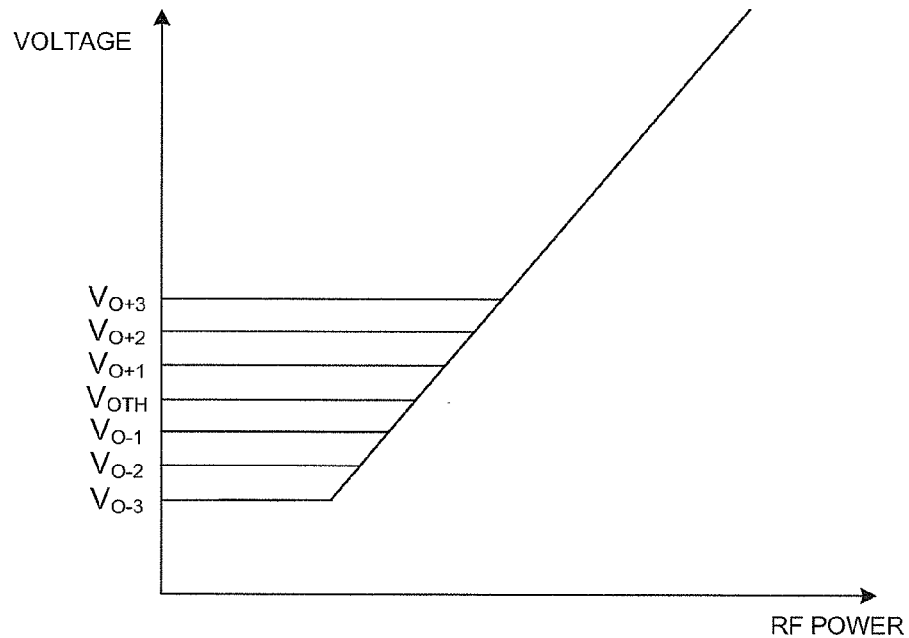
FIG. 10 illustrates the outputs of the negative clipper block within the piecewise linear shaping circuit of FIG. 5.

FIG. 7 depicts one circuit implementing the negative clipper block within the piecewise linear shaping circuit of FIG. 5. All of the DC voltages $V_{+3}, V_{+2}, V_{+1}, V_{TH}, V_{-1}, V_{-2}$ and $V_{-3}$ produced by the multiple DC threshold block 501 and the envelope voltage from the analog envelope detector 303 are provided to the negative clipper block 502. FIG. 8 illustrates the relative levels of the multiple DC voltages and the envelope voltage received by the negative clipper block within the piecewise linear shaping circuit of FIG. 5. FIGS. 9A through 9C illustrate examples of limiting the envelope waveform based on one of the DC voltages using the negative clipper block within the piecewise linear shaping circuit of FIG. 5. FIG. 10 illustrates the outputs of the negative clipper block within the piecewise linear shaping circuit of FIG. 5, plotted in an overlapping manner on a single plot.

As illustrated in FIG. 7, the negative clipper block 502 is constructed of multiple negative clipper circuits 701-707, the outputs $V_{o+3}, V_{o+2}, V_{o+1}, V_{OTH}, V_{o-1}, V_{o-2}$, and $V_{o-3}$ of which are all provided to the sum/average circuit 503. Each of the negative clipper circuits 701-707 in the negative clipper block 502 receives the envelope voltage $V_{DET}$ from the envelope detector 303 and one of the DC voltages $V_{+3}, V_{+2}, V_{+1}, V_{TH}, V_{-1}, V_{-2}$ and $V_{-3}$ produced by the multiple DC threshold block 501, illustrated in FIG. 8. As illustrated for DC voltages $V_{+3}, V_{TH}$ and $V_{-2}$ in FIGS. 9A, 9B and 9C, respectively, the function of each of the negative clipper circuits 701-707 is to process the envelope waveform to limit excursions of that waveform below the voltage set by the input DC voltage from the multiple DC threshold block 501. Each of the negative clipper blocks 701-707 receives a different one of the multiple offset voltages $V_{+3}, V_{+2}, V_{+1}, V_{TH}, V_{-1}, V_{-2}$ and $V_{-3}$ and therefore each negative clipper circuit 701-707 clips at a different level. The effective response of these circuits is shown in FIGS. 8, 9A-9C and 10 relative to the RF signal power into the envelope detector.

Figure 11:
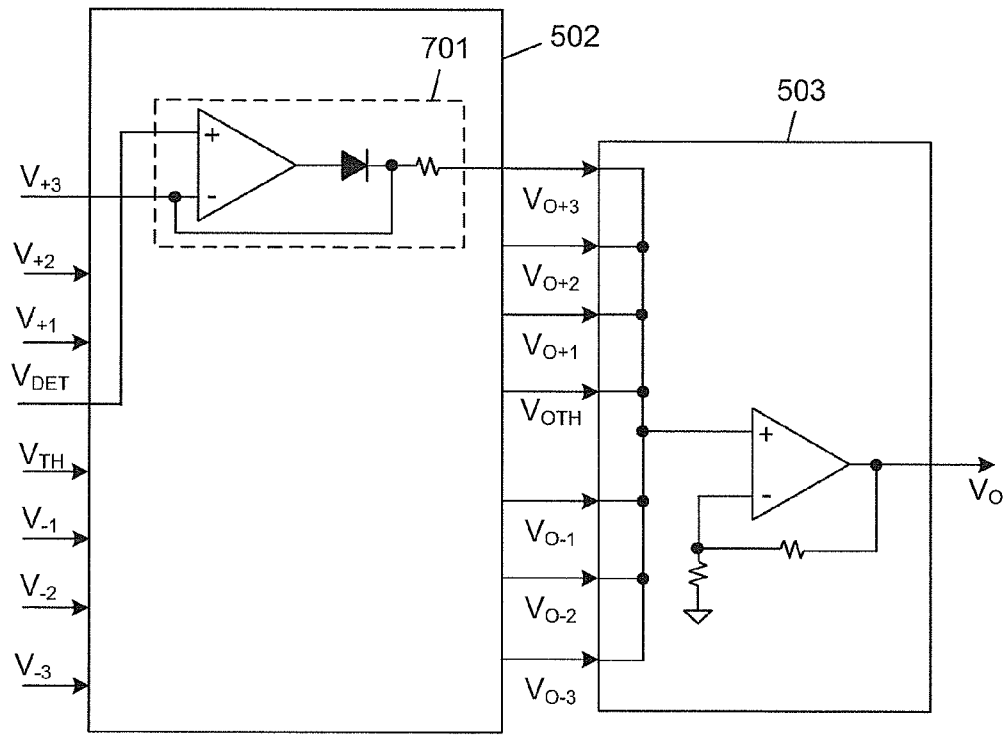
FIG. 11 depicts one circuit implementing the negative clipper block and the sum/average circuit within the piecewise linear shaping circuit of FIG. 5.

FIG. 11 depicts one circuit implementing a negative clipper circuit and the sum/average circuit within the piecewise linear shaping circuit of FIG. 5. Each negative clipper circuit 701-707 has the same structure depicted in FIG. 11 for negative clipper circuit 701, which is composed in the exemplary embodiment of an operational amplifier receiving the detected envelope voltage $V_{DET}$ at the positive input and one of the multiple offset voltages $V_{+3}$, $V_{+2}$, $V_{+1}$, $V_{TH}$, $V_{-1}$, $V_{-2}$ and $V_{-3}$ ($V_{+3}$ for the negative clipper circuit 701) at the negative input. The output of the op-amp passes through a diode, the output of which is fed back to the negative op-amp input, and then through a resistor to be output as the respective one of the outputs $V_{o+3}$, $V_{o+2}$, $V_{o+1}$, $V_{OTH}$, $V_{o-1}$, $V_{o-2}$, and $V_{o-3}$ ($V_{o+3}$ for the negative clipper circuit 701). Each of the negative clipper circuits 701-707 will limit the waveform at a different level corresponding to a break point in the piecewise linear interpolation of the desired shaping function.

The sum/average circuit 503 effectively averages the individual responses of each of the negative clipper circuits 701-707. In the example shown, the sum/average circuit 503 is implemented by a wired-OR connection of the outputs $V_{o+3}$, $V_{o+2}$, $V_{o+1}$, $V_{OTH}$, $V_{o-1}$, $V_{o-2}$, and $V_{o-3}$ from the negative clipper block 502, received at the positive input for an operational amplifier. The negative input for the op-amp within sum/average circuit 503 is connected through a first resistor to a ground voltage and through a second resistor to the op-amp output. The op-amp output is the shaped envelope voltage $V_o$.

Figure 12A:
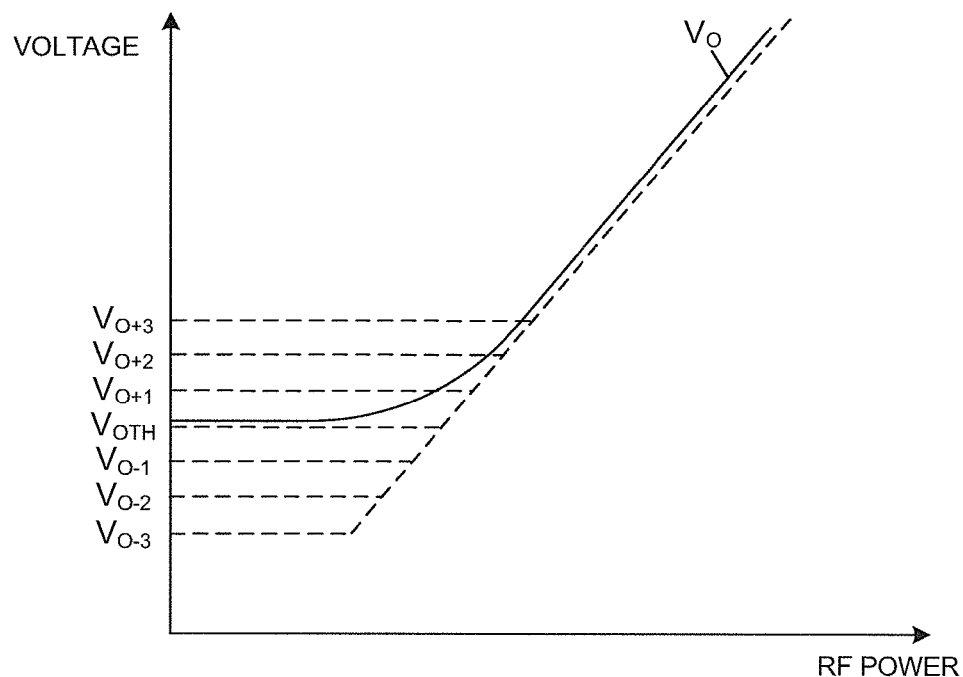
Figure 12B:
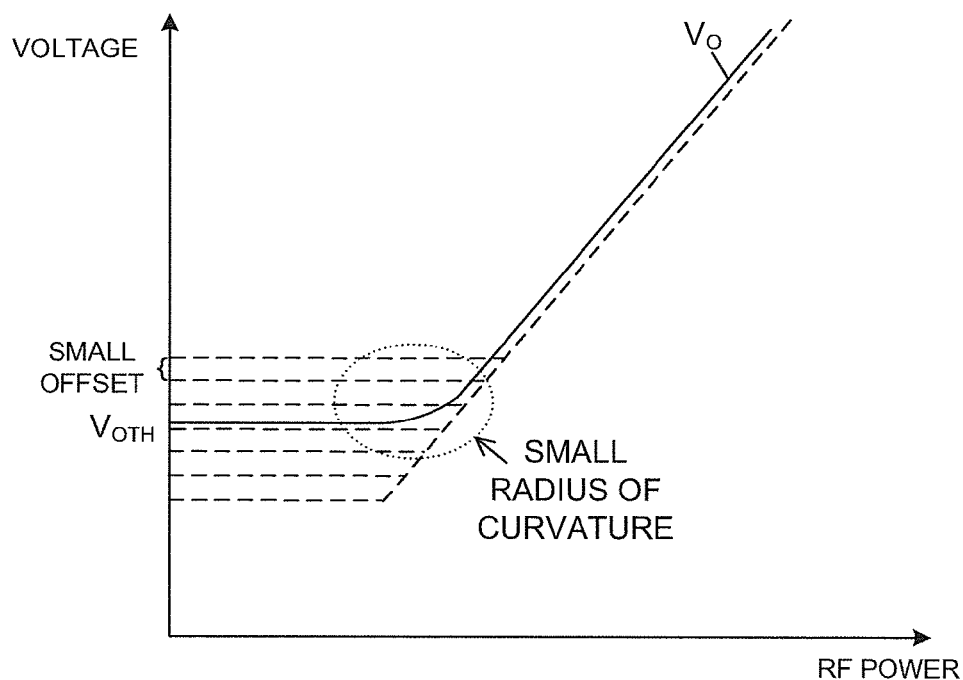

FIGS. 12A through 12C illustrate the shaped envelope voltage output by the piecewise linear shaping circuit of FIG. 5. In operation of the piecewise linear shaping circuit, at the upper end of the envelope range when the envelope voltage is greater than the highest DC voltage $V_{+3}$, the outputs $V_{o+3}$, $V_{o+2}$, $V_{o+1}$, $V_{OTH}$, $V_{o-1}$, $V_{o-2}$, and $V_{o-3}$ from all of the negative clipper circuits 701-707 are the same. Therefore the average output from the sum/average circuit 503 is the same as the envelope waveform, as illustrated in FIG. 12A. At the low end of the envelope range when the envelope voltage is below the lowest DC voltage $V_{-3}$, all of the negative clipper circuits 701-707 are clipping at the levels set by the corresponding DC voltages $V_{+3}$, $V_{+2}$, $V_{+1}$, $V_{TH}$, $V_{-1}$, $V_{-2}$ and $V_{-3}$. In that case the sum/average circuit 503 produces a voltage corresponding to the average of all the DC threshold voltages. Assuming all the offset voltages are positioned symmetrically around the target threshold voltage, then that average output voltage will correspond to the target voltage.

When the envelope voltage is at a level between the minimum and maximum DC threshold voltages $V_{+3}$ and $V_{-3}$, the sum/average circuit 503 will produce a voltage that is a piecewise linear interpolation of the desired shaping functions as shown in FIG. 12A.

To achieve the desired balance of linearity and efficiency in the power amplifier in an envelope tracking system, it is preferable to tailor the threshold voltage and the shaping function curvature radius. In the present disclosure, the minimum drain voltage to the power amplifier transistor can be controlled by setting the appropriate threshold value $V_{OTH}$. The curvature radius can be controlled by setting the offset value or values. As shown in FIGS. 12B and 12C, as the magnitude of the offset value decreases or increases, the breakpoints of the piecewise linear interpolation decrease or increase, which in turn reduces or enlarges the radius of curvature in the transition region for the shaped envelope voltage $V_o$. Notably, the offset between the various DC thresholds can be set to uniform offsets as depicted in the exemplary embodiment or may alternatively be set to non-uniform offsets. Non-uniform offsets may also be used to effect and tailor the shape of the piecewise linear interpolation.

As discussed, the system disclosed provides programmability of the minimum threshold and radius of curvature of the shaping function. However, if programmability is not needed and a fixed shape is known, the multiple DC thresholds may be produced using a voltage divider as depicted in the alternate embodiments of the multiple DC threshold block 501 shown in FIGS. 13A and 13B. Many other implementations of the multiple DC threshold block are possible, all allowing creation of a piecewise linear shaping function based on multiple DC thresholds that are used as breakpoints in the piecewise linear interpolation performed by the negative clipper block and the sum/average circuit.

Figure 14:
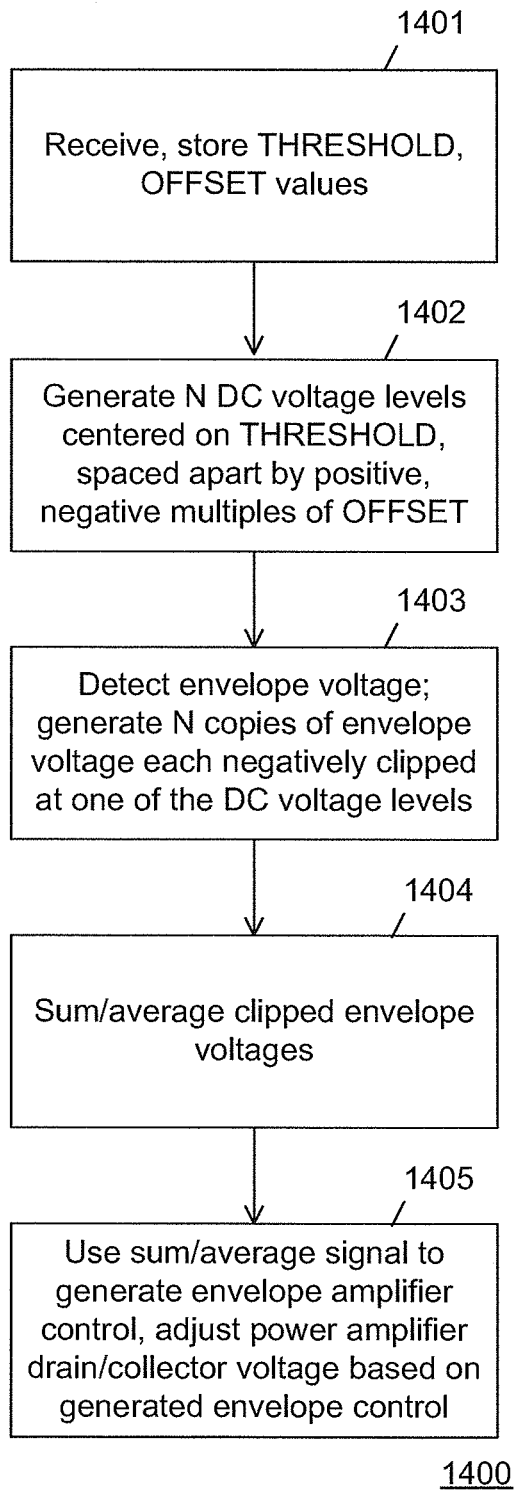
FIG. 14 is a high level flow diagram illustrating a process of programmable envelope-shaping based on piecewise linear interpolation according to one embodiment of the present disclosure.

FIG. 14 is a high level flow diagram illustrating a process of programmable envelope-shaping based on piecewise linear interpolation according to one embodiment of the present disclosure. The process 1400 is performed by operation of system depicted in FIGS. 3C and 5, functioning as described above within the larger systems depicted in FIGS. 1 and 2. Although depicted as a sequence of steps, portions of the process may actually be performed either concurrently or in pipelined fashion within different parts of the systems depicted in FIGS. 3C and 5, and/or may be performed in an ongoing, continuous manner.

The process 1400 begins with receipt and storage of THRESHOLD and OFFSET values (step 1401) to be employed by the programmable analog envelope shaper. As discussed above, the THRESHOLD value corresponds to the desired threshold voltage below which the amplified transmission signal will not be permitted to fall—that is, the amplified signal level at which negative clipping occurs. The OFFSET value defines the spacing of the multiple DC voltage levels generated by the multiple DC level block 501 (i.e., the magnitude of $V_{+1}-V_{TH}$, $V_{+2}-V_{+1}$, etc.). As described above, the value of OFFSET will affect the radius of curvature for the output function of the programmable analog envelope shaper 321 within the transition region between negative clipping and linear gain. A larger value of OFFSET will result in a larger radius of curvature and a more gradual transition between negative clipping and linear gain, while a smaller value of OFFSET will result in a smaller radius of curvature and a more abrupt transition between the two regions.

Using the THRESHOLD and OFFSET values, the process 1400 generates N DC voltage levels (step 1402), where N is a positive, preferably odd integer greater than one. The N DC voltage levels generated are preferably centered on voltage corresponding to the THRESHOLD value and are spaced apart by the OFFSET value. In an exemplary embodiment described in further detail above, the DC voltages consist of the THRESHOLD voltage and N−1 voltages equal to positive or negative integer multiples of OFFSET added to the THRESHOLD voltage.

The process 1400 then detects an envelope voltage for the transmission signal (the signal to be transmitted), or receives an analog voltage representing that envelope voltage, and generates N copies of the envelope voltage each of which is negatively clipped at one the DC voltage levels (step 1403). The result is N different versions of the envelope voltage $V_o$ with different negative clipping applied, such that all N versions may be clipped, fewer than all of the versions may be clipped, or none of the versions may be clipped, depending upon the value of the envelope voltage and the value selected for THRESHOLD. The N versions of the envelope voltage are then summed or, preferably, effectively averaged (step 1404) to generate an analog piecewise interpolation of the envelope voltage. That analog piecewise interpolation is then used, together with an input from the power manager, by an envelope modulator 306 to generate a drain or collector voltage for the power amplifier 305 that amplifies the transmission signal (step 1405).

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An envelope tracking power amplifier system, comprising:
   a multiple direct current level block configured to determine a plurality of different negative clipping thresholds distributed around a programmable threshold corresponding to a desired lower voltage limit for a minimum drain or collector voltage of a power amplifier;
   a negative clipper block configured to generate multiple analog copies of a detected envelope voltage for the transmission signal, each analog version having a different one of the plurality of negative clipping thresholds applied;
   a sum/average circuit configured to generate a shaped envelope voltage based upon a sum or average of the multiple copies of the detected envelope voltage; and
   the power amplifier, wherein the power amplifier is configured to amplify the transmission signal based upon application of the shaped envelope voltage to the drain or collector of the power amplifier.

2. The envelope tracking power amplifier system according to claim 1, wherein the plurality of different negative clipping thresholds are centered around the programmable threshold.

3. The envelope tracking power amplifier system according to claim 2, wherein the plurality of different negative clipping thresholds are uniformly or non-uniformly spaced.

4. The envelope tracking power amplifier system according to claim 2, wherein a spacing between the plurality of different negative clipping thresholds determines a radius of curvature of an output function within a transition region between a minimum voltage and a linear detection region.

5. The envelope tracking power amplifier system according to claim 1, wherein a spacing between adjacent ones of the negative clipping thresholds is programmable.

6. The envelope tracking power amplifier system according to claim 5, wherein the sum/average circuit is further configured to average the multiple copies of the measured envelope voltage.

7. The envelope tracking power amplifier system according to claim 1, wherein the sum/average circuit is further configured to sum the multiple copies of the measured envelope voltage.

8. The envelope tracking power amplifier system according to claim 7, further comprising:
   an envelope detector configured to detect an envelope voltage for the transmission signal.

9. The envelope tracking power amplifier system according to claim 7, wherein the negative clipper block is configured, for each analog copy of the detected envelope voltage, to clip the copy based on a different one of the plurality of negative clipping thresholds applied.

10. A mobile station including the envelope tracking power amplifier system according to claim 1, the mobile station further comprising:
    a transceiver configured to generate the transmission signal and to provide the transmission signal to the envelope tracking power amplifier system; and
    a front-end unit configured to receive the amplified transmission signal from the envelope tracking power amplifier system and to transmit the amplified transmission signal via at least one antenna.

11. A method, comprising:
    determining a plurality of different negative clipping thresholds distributed around a programmable threshold corresponding to a desired lower voltage limit for a transmission signal after being amplified;
    generating multiple analog copies of a detected envelope voltage for the transmission signal, each analog version having a different one of the plurality of negative clipping thresholds applied;
    generating a shaped envelope voltage based upon a sum or average of the multiple copies of the detected envelope voltage; and
    amplifying the transmission signal based upon application of the shaped envelope voltage to the drain or collector of the power amplifier.

12. The method according to claim 11, wherein the plurality of different negative clipping thresholds are centered around the programmable threshold.

13. The method according to claim 12, wherein the plurality of different negative clipping thresholds are uniformly or non-uniformly spaced.

14. The method according to claim 11, wherein a spacing between the plurality of different negative clipping thresholds determines a radius of curvature of an output function within a transition region between a minimum voltage and a linear detection region.

15. The method according to claim 11, wherein a spacing between adjacent ones of the negative clipping thresholds is programmable.

16. The method according to claim 11, wherein generating a shaped envelope voltage based upon the multiple copies of the detected envelope voltage further comprises:
    averaging the multiple copies of the measured envelope voltage.

17. The method according to claim 11, wherein generating a shaped envelope voltage based upon the multiple copies of the detected envelope voltage further comprises:
    summing the multiple copies of the measured envelope voltage.

18. The method according to claim 11, further comprising:
    detecting an envelope voltage for the transmission signal.

19. The method according to claim 17, further comprising:
    for each analog copy of the detected envelope voltage, clipping the copy based on a different one of the plurality of negative clipping thresholds applied.

20. The method according to claim 11, further comprising:
    generating the transmission signal; and
    receiving the amplified transmission signal and transmitting the amplified transmission signal via at least one antenna.

* * * * *